United States Patent
Gaertner et al.

(10) Patent No.: US 9,435,376 B2
(45) Date of Patent: Sep. 6, 2016

(54) MULTI-LAYERED PLAIN BEARING

(71) Applicant: Miba Gleitlager GmbH, Laakirchen (AT)

(72) Inventors: Walter Gaertner, Gmunden (AT); Johann Nagl, Stadl-Paura (AT); Christian Uebleis, Weisskirchen a.d. Traun (AT); Jakob Zidar, Altmuenster (AT)

(73) Assignee: Miba Gleitlager Austria GmbH, Laakirchen (AT)

( * ) Notice: Subject to any disclaimer, the term of this patent is extended or adjusted under 35 U.S.C. 154(b) by 83 days.

(21) Appl. No.: 14/571,613

(22) Filed: Dec. 16, 2014

(65) Prior Publication Data
US 2015/0219154 A1 Aug. 6, 2015

(30) Foreign Application Priority Data
Jan. 31, 2014 (AT) .................................. 50070/2014

(51) Int. Cl.
F16C 33/12 (2006.01)
C23C 14/16 (2006.01)
C22C 13/00 (2006.01)

(52) U.S. Cl.
CPC ............. F16C 33/122 (2013.01); C22C 13/00 (2013.01); C23C 14/165 (2013.01);
(Continued)

(58) Field of Classification Search
CPC .. F16C 33/121; F16C 33/122; F16C 33/125; F16C 33/127; F16C 2204/30; F16C 2204/34; F16C 2223/60; C22C 13/00; C22C 13/02; C23C 14/165
See application file for complete search history.

(56) References Cited

U.S. PATENT DOCUMENTS 2,459,172 A 1/1949 Luetkemeyer et al.
2,831,803 A 4/1958 Waterman et al.
(Continued)

FOREIGN PATENT DOCUMENTS

DE 10 21 228 B 12/1957
DE 10 25 230 A 2/1958
(Continued)

OTHER PUBLICATIONS

Austrian Office Action in A 50070/2014, dated Nov. 10, 2014, with English translation of relevant parts.
(Continued)

*Primary Examiner* — Alan B Waits
(74) *Attorney, Agent, or Firm* — Collard & Roe, P.C.

(57) ABSTRACT

The invention relates to a multi-layered plain bearing (1) comprising a sliding layer (5) made from a tin-based alloy, which contains between 1 wt. % and 8 wt. % Sb, between 8 wt. % and 20 wt. % Cu and if necessary at least one of the elements Si, Cr, Ti, Zn, Ag and Fe, wherein the proportion of each of these elements is between 0.1 wt. % and 2 wt. %, the total content of all of the alloy elements is a maximum of 30 wt. % and remainder is formed by Sn, wherein at least a proportion of the Cu with Sn is present as a copper-rich deposit in the tin matrix with a maximum particle size of 50 nm and/or in addition contains at least one further element from a second group consisting of Al, Bi and Ni, wherein the proportion of the at least one further element is between 0.1 wt. % and 5 wt. % for each of said elements, and wherein the sliding layer (5), which contains at least one element of the second element group, is deposited by a PVD-method when the particle size of the nanoparticles is greater than 50 nm.

16 Claims, 1 Drawing Sheet

(52) U.S. Cl.
CPC .......... *F16C 33/121* (2013.01); *F16C 33/125* (2013.01); *F16C 33/127* (2013.01); *F16C 2204/30* (2013.01); *F16C 2223/60* (2013.01)

(56) References Cited

U.S. PATENT DOCUMENTS

| | | | | |
|---|---|---|---|---|
| 5,705,126 | A * | 1/1998 | Bohsmann | C22C 13/02 420/561 |
| 6,492,039 | B2 * | 12/2002 | Huhn | B32B 15/01 384/912 |
| 6,575,635 | B1 * | 6/2003 | Tsuji | F16C 33/124 384/276 |
| 8,586,513 | B2 * | 11/2013 | Zidar | C22C 13/00 384/462 |
| 9,074,627 | B2 * | 7/2015 | Zidar | F16C 33/12 |
| 2002/0031684 | A1 * | 3/2002 | Niegel | C25D 3/60 428/675 |
| 2010/0047605 | A1 | 2/2010 | Knoblauch et al. | |
| 2011/0143975 | A1 | 6/2011 | Zidar | |
| 2013/0084209 | A1 * | 4/2013 | Seelig | C22C 13/00 420/561 |

FOREIGN PATENT DOCUMENTS

| | | |
|---|---|---|
| DE | 1 053 275 B1 | 3/1959 |
| DE | 100 54 461 A1 | 5/2001 |
| DE | 101 45 389 A1 | 4/2003 |
| DE | 20 2010 017 555 U1 | 1/2012 |
| EP | 2 333 129 A1 | 6/2011 |
| EP | 2 749 661 A1 | 7/2014 |
| GB | 730 238 A | 5/1955 |
| JP | 2007-270893 A | 10/2007 |
| WO | 2009/108975 A1 | 9/2009 |

OTHER PUBLICATIONS

Austrian Search Report in A 50070/2014, dated Nov. 6, 2014, with English translation of relevant parts.

Dettner Heinz W., Elze Johannes; Handbuch der Galvanotechnik Band II; Munich: Carl Hansa Verlag 1966; pp. 863-868.

* cited by examiner

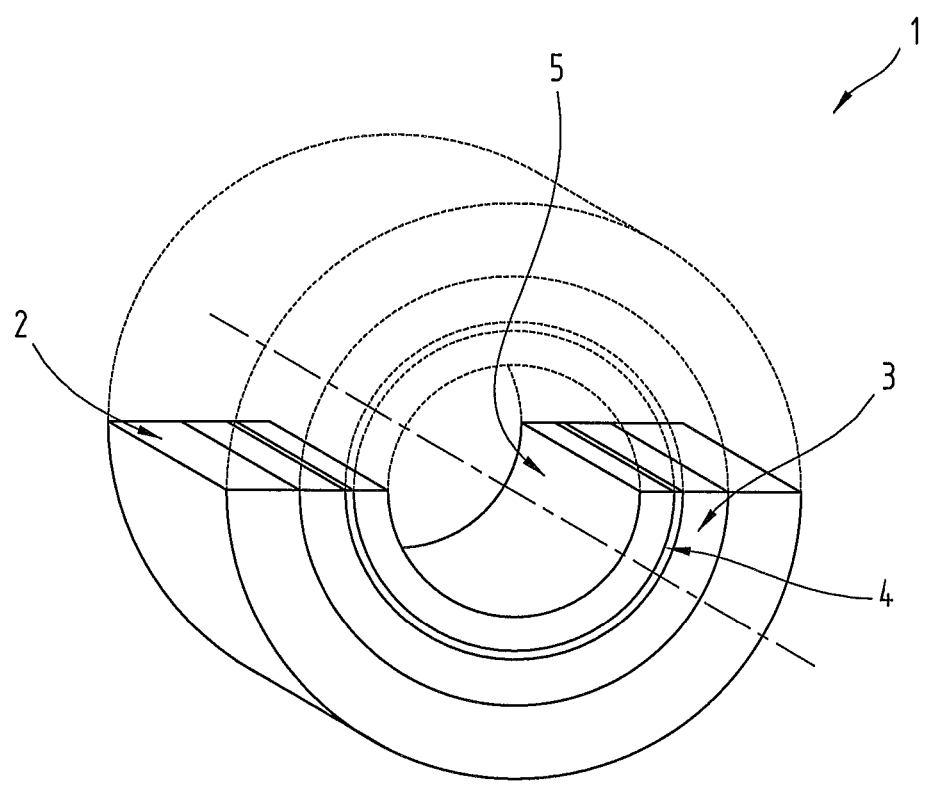

MULTI-LAYERED PLAIN BEARING

CROSS REFERENCE TO RELATED APPLICATIONS

Applicant claims priority under 35 U.S.C. §119 of Austrian Application No. A 50070/2014 filed on Jan. 31, 2014, the disclosure of which is incorporated by reference.

The invention relates to a multi-layered plain bearing comprising a support layer and a sliding layer, and if necessary a bearing metal layer, which is arranged on the support layer, and if necessary at least one intermediate layer, which is or are arranged between the sliding layer and the support layer, in particular on the bearing metal layer, wherein the sliding layer consists of a tin-based alloy with a tin matrix, which in addition to tin also contains antimony, copper and if necessary at least one element from a first group consisting of silicon, chromium, titanium, zinc, silver and iron, wherein the proportion of antimony is between 1 wt. % and 8 wt. %, the proportion of copper is between 8 wt. % and 20 wt. %, the proportion of each of the elements silicon, chromium, titanium, zinc, silver and iron is between 0.1 wt. % and 2 wt. %, and wherein the total content of all of the alloy elements is a maximum of 30 wt. % and the remainder is formed by tin and manufacturing-related impurities, wherein at least a proportion of the copper forms a copper-rich hard phase with tin, which is present as a deposit in the tin matrix.

A foreseeable increase in the ignition pressures of large engines in the future means that it necessary to provide a plain bearing solution with a lower predisposition to fatigue than known plain bearings made of previously used materials. At the same time it is necessary to improve the fatigue strength and reduce the susceptibility to seizing and corrosion with respect to heavy fuel operation. It is also necessary to make the sliding layer adaptable to dirt particles and to balance out the manufacturing tolerances of shafts.

The use of tin-based alloys for the sliding layers of plain bearings has already been described in the prior art.

For example WO 2009/108975 A1 describes a cast plain bearing alloy made of white metal with a tin base that is cadmium-free, lead-free, arsenic-free and chromium-free apart from unavoidable impurities, which contains 4 to 30 wt. % antimony as the main alloy element and 1 to 10 wt. % copper, and which comprises at least one element from an element group containing cobalt, manganese, scandium and germanium in a total concentration relative to the used elements of this group of between 0.2 and 2.6 wt. % and at least one element from an element group containing magnesium, nickel, zirconium and titanium in a total concentration relative to the used elements of this group of between 0.05 and 1.7 wt. %, wherein the total proportion of antimony and copper with an antimony content corresponding to at least three times the copper content is at most 35 wt. %. The white metal can have a proportion of aluminum of 0.05 to 2.5 wt. %.

EP 2 333 129 A1 describes a multi-layered plain bearing comprising at least one support metal layer, a sliding layer and if necessary a bearing metal layer arranged between the sliding layer and the support metal layer. Between the bearing metal layer and the sliding layer an intermediate layer can be arranged which consists of one or more part layers, which are galvanically deposited or formed by diffusion, wherein each of the part layers contains one or more elements of the group chromium, nickel, iron, cobalt, copper and tin. The galvanically deposited sliding layer consists of a tin-based alloy, which in addition to tin as the main alloy element contains at least one further element from the group antimony and copper, possibly lead and/or bismuth, and possibly at least one element from a group comprising zirconium, silicon, zinc, nickel and silver, and unavoidable impurities originating from the manufacture of the element, wherein the proportion of antimony is a maximum of 20 wt. %, the proportion of copper is a maximum of 10 wt. %, the total proportion of lead and bismuth is a maximum of 1.5 wt. %, the total proportion of copper and antimony is at least 2 wt. % and the total proportion of zirconium, silicon, zinc, nickel and silver is a maximum of 3 wt. % and wherein tin is bonded in the form of intermetallic phases and free as a tin phase with beta-tin gains, which have an average size with at least a µm value calculated according to the formula $K=A/(S+3*C+O)$, wherein K is the average grain size in µm, A is a factor, S is the alloy amount of antimony in wt. %, C the total alloy amount of copper, silver, nickel, and O the total alloy amount of lead, bismuth, zinc, other alloy elements and non-metal particles in wt. %, and factor A has the value 50, in particular 70, preferably 100 and wherein the average grain size denotes the arithmetic average of the values, which is calculated for each grain as a geometric average of the largest and smallest dimension of said grain, as seen in cross-section, wherein to form the average value the largest grain identifiable in cross-section to the smaller grains are taken until the sum of the cross-sectional areas of the grains used to form the average reaches 80% of the total cross-sectional area of all beta-tin grains, wherein the tin grains with a beta-tin structure in the tin-based alloy in each case have an average grain size of at least 2.5 µm. The bearing metal layer can be a copper-tin alloy. Steel is given as the material for the support metal layer.

The objective of the present invention is to create a plain bearing for a fast running and medium-speed (large) engine, in particular a four stroke diesel engine, for heavy fuel operation.

It should be mentioned at this point that a large engine is defined as an engine which comprises a plain bearing which has a diameter of at least 200 mm. The usual variables lie for example within a range of between 200 mm and 400 mm diameter.

The terms "fast running" or "medium speed" are defined in four-stroke large diesel engines as a speed range of typically 750-1000 rpm or 500-750 rpm.

The term "heavy fuel operation" relates to an engine which uses heavy fuel oil as the fuel.

The objective of the invention is achieved by means of the aforementioned multilayered plain bearing, in which the copper-rich hard phase is present in form of nanoparticles with a maximum particle size of 50 nm and/or in which the tin-based alloy contains in addition to tin, antimony and copper and if necessary at least one element of the first group, at least one further element from a second group consisting of aluminum, bismuth and nickel, wherein the proportion of the at least one further element is between 0.1 wt. % and 5 wt. % for each of the elements aluminum, bismuth and nickel and wherein the sliding layer (5) which contains at least one of said elements of the second element group, is deposited by a PVD-method, when the particle size of the nanoparticles is greater than 50 nm.

It is an advantage that the hard nanoparticles of the copper-rich tin phase in the tin matrix have a diffusion-impairing effect and prevent growth of the grain size. Furthermore, it is more difficult for cracks to spread. This increases the hardness and stability of the soft tin base, whereby high fatigue strength is achieved and at the same time the ductile properties of the material are maintained.

Alternatively or in addition to this by adding at least one of the further elements aluminum, bismuth and nickel grain refinement can be achieved, if the depositing method itself do not produce the desired grain size. In this way it is possible to achieve no loss of hardness or no essential loss of hardness of the sliding layer during the operation of the plain bearing. In this way the loadability of the sliding layer can be improved.

It is an advantage if both the copper-rich nano-hard particles and also aluminum and/or bismuth and/or nickel are embedded into the sliding layer. However, the aforementioned requirements for a plain bearing for said (large) engines can also be achieved more effectively if either copper-rich nano-hard particles or aluminum and/or bismuth and/or nickel are included in the sliding layer.

According to one embodiment variant the total content of all of the alloy elements in addition to tin is between 10 wt. % and 25 wt. %. In this way the aforementioned properties of the sliding layer can be improved further.

Preferably, the bearing metal layer is made of bronze, wherein the bronze according to a preferred embodiment variant consists of CuPb4Sn4Zn4, CuPb5Sn5Zn5, CuPb7Sn7Zn4, CuPb9Sn5, CuPb10Sn10, CuPb15Sn7, CuPb22Sn2, CuPb20Sn4, CuPb22Sn8, CuPb24Sn2, CuPb24Sn, CuPb24Sn4, CuSn5Zn, CuAl10Ni, CuSn10. (For the composition of all of the given alloy variants there is a tolerance range of up to 5 percentage points, for example CuPb4±2.5% Sn4±2.5% Zn4±2.5%). In particular, with a bearing metal layer made of bronze or said bronzes in multi-component plain bearings with the sliding layer according to the invention an improved adaptability of the sliding layer to dirt particles can be achieved, wherein such a bearing metal layer also has correspondingly effective emergency running properties.

The sliding layer preferably has layer thickness in a range of 10 μm to 60 μm in a multi-component plain bearing with a bearing metal layer or in a range of 150 μm to 1000 μm in a multi-component plain bearing without a bearing metal layer. In this way it is achieved that the sliding layer has good embeddability properties for dirt particles which may appear during use without being prone to fatigue fractures.

With respect to the adaptive properties of the sliding layer it is an advantage if the latter has a Vickers hardness of between 15 HV(0.001) and 70 HV(0.001). In this way it is possible to achieve an improved embeddability of the sliding layer for dirt particles at the same time as avoiding spontaneous failure.

Preferably, the intermediate layer and/or the sliding layer is deposited from the gas phase onto the bearing metal layer. In this way by slowing down or preventing particle diffusion the coagulation of precipitations can be reduced or prevented and thus structures are produced that are outside the thermodynamic equilibrium.

For a better understanding of the invention the latter is explained in more detail with reference to the following FIGURE.

In a diagrammatically simplified representation:

FIG. 1 is a multi-layered plain bearing in the form of a half shell in side view.

First of all, it should be noted that the details relating to position used in the description, such as e.g. top, bottom, side etc. relate to the currently described and represented FIGURE and in case of a change in position should be adjusted to the new position accordingly.

FIG. 1 shows a multi-layered plain bearing 1 in the form of a plain bearing half shell in side view. The preferred embodiment of said multi-layered plain bearing 1 is shown, namely a four-layered variant consisting of a support layer 2, a bearing metal layer 3 arranged directly on the support layer 2, an intermediate layer 4 arranged directly on the bearing metal layer 3 and a sliding layer 5 arranged directly on the intermediate layer 4.

This principle structure of such four-layered bearings, as found for example in mofor vehicles, is known from the prior art so that further explanations are unnecessary at this point. It should be mentioned however that additional layers can be provided, for example an adhesive layer between the bearing metal layer 3 and the support metal layer 2 or a running-in layer on the sliding layer 5. Likewise an anti-fretting layer can be arranged on the rear side of the support layer 2.

Within the scope of the invention the multi-layered plain bearing 1 can also be designed differently, for example as a bearing bush, as indicated by dashed lines in FIG. 1. Likewise embodiments such as thrust rings, axially running sliding shoes or the like are possible. In addition multi-layered plain bearings 1 are possible which cover an angular range other than 180°, so that the multi-layered plain bearing 1 need not necessarily be designed as a half shell, although this is the preferred embodiment.

The support metal layer 2 is made from a material which gives the multi-layered plain bearing 1 the necessary structural strength, for example brass or bronze. In the preferred embodiment variant of the multi-layered plain bearing 1 the latter is made of a steel however.

For the bearing metal layer 3 many different alloys can be used. Examples here are bearing metals with an aluminum base, for example AlSn6CuNi, AlSn20Cu, AlSi4Cd, AlCd3CuNi, AlSi11Cu, AlSn6Cu, AlSn40, AlSn25CuMn, AlSi11CuMgNi, AlZn4Si. However, in the preferred embodiment variant of the multi-layered plain bearing 1 the bearing metal layer 3 is made of bronze because of the higher fatigue strength. In particular, the bearing metal layer 3 is made from a bronze which in addition to copper contains lead in an amount of 2 wt. % to 30 wt. % and/or tin in an amount of 1 wt. % to 15 wt. % and/or zinc in an amount of 1 wt. % to 8 wt. % and/or aluminum in an amount of 1 wt. % to 4 wt. % and/or nickel in an amount of 1 wt. % to 4 wt. %. For example, the bearing metal layer 3 can be formed by CuPb4Sn4Zn4, CuPb5Sn5Zn5, CuPb7Sn7Zn4, CuPb9Sn5, CuPb10Sn10, CuPb15Sn7, CuPb22Sn2, CuPb20Sn4, CuPb22Sn8, CuPb24Sn2, CuPb24Sn, CuPb24Sn4, CuSn5Zn, CuAl10Ni, CuSn10. In the composition of all of the given alloy variants there is a tolerance range of up to 5 percentage points, as already explained above.

Preferably, the bearing metal layer 3 is made from a bronze, which in addition to copper contains 17 wt. % to 27% wt. % lead, 0.5 wt. % to 8.5% wt. % tin or in a lead-free variant (<0.05 wt. % lead) 3.5 wt. % to 7.0 wt. % tin and 0.5 wt. % to 2.5 wt. % zinc.

The bearing metal layer 3 can be deposited or arranged on the support layer by a conventional method known from plain bearing technology. For example a bimetal consisting of the support layer 2 and the bearing metal layer 3 can be produced by rolling on the bearing metal layer 3. Likewise the bearing metal layer 3 can be cast onto the support layer 2. If necessary said bimetal is reshaped and/or processed by machining.

The intermediate layer 4 is deposited on the bearing metal layer 3 (or if necessary on the support layer 2), in particular from the gas phase, preferably according to a cathode sputtering method or an electron beam vapor deposition method. As said methods are known in principle from the prior art reference is made to the latter to avoid repetition.

Preferably, the intermediate layer 4 is made of nickel or a nickel alloy or iron or an iron alloy, for example a stainless steel. In particular, the intermediate layer 4 is deposited with a layer thickness of at least 0.5 µm, preferably at least 0.8 µm, and a maximum of 3 µm, preferably a maximum of 2.1 µm.

It is also preferable if the intermediate layer 4 has a hardness, which corresponds at the most to ten times the hardness of the sliding layer 5. Of course, same methods for determining said relationship are applied to the hardness measurements.

It is also possible to provide a plurality of intermediate layers 4 between the bearing metal layer 3 and the sliding layer 5. Thus it can be an advantage for example if an intermediate layer 4 made of stainless steel is provided and a further intermediate layer 4 made of nickel is arranged thereon. In this case the intermediate layer 4 made of stainless steel can have a layer thickness between 1 µm and 2 µm and the additional intermediate layer 4 made of nickel can have a layer thickness between 0.1 µm and 0.5 µm.

The sliding layer 5 is made of a tin-based alloy, which in addition to tin also contains antimony and copper. If necessary the sliding layer 5 can contain at least one element from a first group consisting of silicon, chromium, titanium, zinc, silver and iron. Furthermore, it preferably contains a further element from a second group consisting of aluminum, bismuth and nickel.

The proportion of antimony is between 1 wt. % and 8 wt. %, in particular between 1 wt. % and 5 wt. %. In an amount below 1 wt. % the sliding layer becomes too soft, thereby worsening the fatigue strength. However, the sliding layer is too hard with an amount of more than 8 wt. % which makes the adaptability of the sliding layer 5 in the running-in phase insufficient.

The amount of copper is between 8 wt. % and 20 wt. %, in particular between 9 wt. % and 15 wt. %. In an amount of less than 8 wt. % the amount of forming nanoparticles is too low to meet the aforementioned requirement profile of the sliding layer 5. However, if the amount of copper exceeds 20 wt. % there is more a coarse grained deposition of the copper-rich hard phase, whereby the desired properties are also not achieved.

The proportion of each of the elements silicon, chromium, titanium, zinc, silver and iron can be between 0.1 wt. % and 2 wt. %, in particular between 0.25 wt. % and 1.5 wt. %.

Silicon can be added to improve the fatigue strength and to slow down diffusion effects, whereby there can be softening of the layer.

By adding chromium the grain-boundary diffusion can be slowed down.

Titanium and iron form hard phases with tin, whereby the fatigue strength of the sliding layer 5 can be improved.

By adding zinc or silver there is a grain refinement of the structure so that there is no loss of hardness during operation, and on the other hand the fatigue strength and the loadability of the sliding layer 5 is improved.

Proportions of said elements outside the said limits result in a property profile of the sliding layer 5 which does not meet the above requirements.

The amount of each of the additional elements aluminum, bismuth and nickel can be between 0.1 wt. % and 5 wt. %, in particular between 0.1 wt. % and 3.1 wt. %.

Aluminum reduces the coarse grain nature of the structure and can also improve the fatigue strength of the sliding layer 5.

By adding nickel it is possible to achieve a refinement of the grain size of the structure, whereby on the one hand the diffusion is inhibited so that there is no loss of hardness during operation and on the other hand in this way the fatigue strength and loadability of the sliding layer 5 is improved.

The addition of bismuth refines the structure and hinders the grain-boundary diffusion under the effect of temperature.

It has been found that amounts of aluminum, bismuth and nickel outside the given amount ranges do not lead to the desired result.

The total content of all of the alloy elements in addition to tin is restricted to a maximum of 30 wt. %, preferably to an amount between 10 wt. % and 25 wt. %. It was found that total amounts above the given ranges result in brittleness and those below the given ranges result in too little hardness and a low fatigue strength of the sliding layer 5.

Tin and the usual, manufacturing-related impurities forms the remainder to 100 wt. %.

In addition to said preferred four-layered structure of the multi-layered plain bearing 1 it is also possible within the scope of the invention for the sliding layer 5 to be deposited directly on the support layer 2. In this case the support layer 2 can also be a connecting rod if necessary, the sliding layer 5 being deposited in the eye of the latter.

Furthermore, it is possible that the multi-layered plain bearing 1 has the structure of a support layer 2 with a bearing metal layer 3 arranged directly thereon and sliding layer 5 arranged directly on the latter.

The sliding layer 5 is preferably deposited from the gas phase onto the intermediate layer 4. In particular, the gas phase deposition is performed according to a cathode sputtering method or an electron beam vaporizing method, wherein preferably layer thicknesses are produced of at least 10 µm, preferably at least 15 µm, and at most 60 µm, preferably at most 50 µm, as long as a bearing metal layer 3 is provided. In the absence of a bearing metal layer 3 layer thicknesses of at least 150 µm, preferably at least 200 µm, and at most 1000 µm, preferably at most 750 µm are preferably produced.

For the deposition by means of sputtering methods the following parameters can be used:
voltage on substrate: −150 V to 0 V
atmosphere: argon
pressure: 7×10-4 to 6×10-3 mbar,
temperature: 80 to 160° C.
voltage on the targets: −450 V to −800 V Deposition by means of a PVD process is preferable as this takes place outside the thermodynamic equilibrium, so that the particle diffusion and coagulation of deposits can be prevented.

During the deposition of the sliding layer 5 the copper-rich hard phase is formed which consists of q-bronze ($Cu_6Sn_5$). Owing to the conditions of deposition the latter have a maximum grain size of 50 nm. Preferably, the grain size of the nanoparticles is between 10 nm and 40 nm.

Preferably, the tin-based alloys after deposition have a Vickers hardness of between 15 HV(0.001) and 70 HV(0.001), in particular between 35 HV(0.001) and 60 HV(0.001).

The following sliding layers 5 were produced by means of a PVD method. In this case plain bearing half shells consisting of a support layer 2 made of steel and a leaded bronze as a bearing metal layer 3 are inserted into an electromagnetically produced metal vapor, and a sliding layer 5 with a thickness of about 15 µm was applied. The sliding layer 5 can be produced both from a single source and at the same time from a plurality of sources with the same or different composition.

EXAMPLE 1

As the sliding layer 5 a layer was produced with the composition SnCu11Sb3, deposited by the magnetron sputtering of an individual sputtering target (substrate temperature 110° C., average coating rate 0.19 μm/min, process gas argon at a pressure of 0.7 Pa, voltage on substrate −50V, voltage on target 480V, target cornposition SnCu11Sb3). Said sliding layer 5 was deposited on an intermediate layer 4 made of nickel with a layer thickness of 1 μm.

The sliding layer 5 shows finely distributed nano-deposits of $Cu_6Sn_5$ in the tin phase (minimal/average/maximum size of the nano-deposits 10/25/37 nm). The layer has a hardness of 42 HV(0.001).

EXAMPLE 2

As the sliding layer 5 a layer with the composition SnCu12Sb4 was deposited by magnetron sputtering two sputtering targets with the same chemical composition on an intermediate layer 4 made of stainless steel (X5CrNi18-10) (substrate temperature 135° C., average coating rate 1.4 μm/min, process gas argon at a pressure of 3.8 Pa, voltage on substrate 0V, voltage on the target respectively 690V). The intermediate layer 4 had a layer thickness von 1.5 μm.

The sliding layer 5 shows finely distributed nano-deposits of $Cu_6Sn_5$ in the tin phase (minimum/average/maximum size of the nano-deposits 14/34/45 nm). The layer has a hardness of 47 HV(0.001).

EXAMPLE 3

As the sliding layer 5 a layer with the composition SnCu13Sb2Ni1 was deposited by magnetron sputtering two sputtering targets of different chemical composition (target 1: SnSb3, target 2: CuNi8) on an intermediate layer 4 made of nickel (substrate temperature 90° C., average coating rate 0.52 μm/min, process gas argon at a pressure of 1.5 Pa, voltage on substrate 0V, voltage on target 1 825V, voltage on target 2 467 V). The intermediate layer 4 had a layer thickness of 2 μm.

The sliding layer 5 shows finely distributed nano-deposits of $Cu_6Sn_5$ in the tin phase (minimum/average/maximum size of the nano-deposits 12/21/38 nm). The layer has a hardness of 50 HV(0.001).

The intermediate layers 4 were produced by magnetron sputtering individual alloy targets (substrate temperature and process gas pressure see embodiment variants. Voltage on target 640 V, average coating rate 0.5 μm/min).

EXAMPLE 4

As the sliding layer 5 a layer with composition SnCu10Sb4Ni1 was produced by electron beam vaporizing a steel strip from two sources (direct coating without intermediate layer and bearing metal layer 3). (Source 1: graphite crucible with pure antimony, temperature 720° C., electron beam power 5.5 kW; source 2 water-cooled copper-crucible with SnCu25Ni10, temperature 1400° C., electron beam power 80 kW). At a feed rate of the steel strip of 0.2 mm/s a layer thickness of 800 μm was applied, after shaping and fine boring the plain bearing the layer thickness was 650 μm.

The sliding layer 5 has finely distributed nano-deposits of $Cu_6Sn_5$ in the tin phase (minimum/average/maximum size of the nano-deposits 11/29/43 nm). The layer has a hardness of 57 HV(0.001).

On a testing machine the dirt tolerance and the fatigue strength of the plain bearing half shells with the respective sliding layer 5 according to examples 1 to 4 was tested in comparison to materials from the prior art. As the prior art materials the following compositions were produced:

Comparison example A: galvanically applied, 15 μm thick PbSn18Cu2 sliding layer on lead bronze CuPb22Sn3 (deposit from fluoroborate electrolyte, cf. Dettner Heinz W., Elze Johannes; Handbuch der Galvanotechnik Band II; Munich: Carl Hansa Verlag 1966; page 863 ff). Said sliding layer has from experience excellent dirt tolerance with good fatigue strength.

The layer has a hardness of 14 HV(0.001).

Comparison example B: sputtered AlSn20Cu1 sliding layer on lead bronze CuPb22Sn3.

Deposit conditions: substrate temperature 140° C., average coating rate 0.7 μm/min, process gas argon at a pressure of 1.5 Pa, voltage on substrate 0V, voltage on target 630V. Intermediate layers by means of magnetron sputtering of nickel-target (substrate temperature and process gas pressure such as sliding layer, voltage on target 640 V, average coating rate 0.5 μm/min).

The layer has a hardness of 84 HV(0.001).

Nano-deposits with a maximum grain size of 50 nm could not be found either in comparison example A or comparison example B in the hard phase.

Furthermore, the casting production of the described alloys does not lead to the formation of nano-deposits.

From experience said sliding layer has an average dirt tolerance and excellent fatigue strength.

Measuring methods for determining the grain size of the nano-deposits: for each sample REM-FIB images (enlargement 50 k, detail 2.4×2.4 μm) were subjected to a statistical image evaluation for determining the grain size of the nano-deposits in the hard phase.

During the dirt tolerance test under an oscillating load with a specific load amplitude of 75 MPa the oil is contaminated successively with hard particles and the amount of dirt of dirt measured at the point of the spontaneous failure of the bearing shell. In this way it is possible to determine the good quality and dirt tolerance of the sliding layer 5.

The test of fatigue strength was performed with a swelling load and a specific load amplitude of 75 MPa over 3 million load cycles at a sliding speed of 12 m/s. After the test the half shells were measured and the wear of the sliding layer 4 determined. The fatigue strength of the sliding layer 5 was assessed visually. The visual evaluation of 1 to 5 extends from the condition very good (1: running marks) to very bad (5: large and severe fatigue fractures).

The results are summarized in table 1.

TABLE 1

| Example | Dirt tolerance Amount of dirt [mg] | Fatigue strength | |
|---|---|---|---|
| | | Visual assessment | Wear [μm] |
| 1 | 258 | 2 | 1.3 |
| 2 | 250 | 2 | 2.1 |
| 3 | 219 | 1.5 | 1.6 |
| 4 | 224 | 1.5 | 1.9 |
| A | 300 | 4 | 8.0 |
| B | 89 | 1 | 2.0 |

Table 1 shows the results averaged over four tests respectively. It can be seen that very good dirt tolerance was achieved with the sliding layers 5 according to examples 1 to 4. At the same time according to examples 1 to 4 the sliding layers 5 after continuous load tests show only isolated cracks and no wear beyond the running-in requirement. This combination comprises none of the materials from the prior art.

In addition to the aforementioned examples additional compositions of the sliding layer were produced as listed in table 2. All of the details of compositions in the following table 2 are defined in wt. %. Tin forms the remainder to 100 wt. % respectively. The abbreviations ZS and ES stand for an intermediate layer in general (ZS) or for an intermediate layer 4 made of stainless steel X5CrNi18-10 (ES).

Said examples are representative of compositions of the sliding layer 5 according to the aforementioned amount ranges of the alloy elements.

The sliding layers 5 of examples 14 to 22 were deposited according to one of the aforementioned PVD methods.

TABLE 2

| Ex. | Sb | Cu | Si | Cr | Bi | Ti | Fe | Al | Ni | Zn | Ag | ZS |
|---|---|---|---|---|---|---|---|---|---|---|---|---|
| 5a | 3.2 | 8.9 | | | | | | | | | | Ni |
| 5b | 3.2 | 8.9 | | | | | | | | | | Ni |
| 6 | 1.3 | 12.8 | | 0.5 | | | 0.2 | | | | | ES |
| 7 | 2.0 | 11.7 | | | | 1.7 | | | | | | Ni |
| 8 | 3.9 | 10.4 | | | 0.2 | | | | | 2.0 | | Ni |
| 9 | 2.2 | 11.0 | | | | | | | | | 1.8 | ES |
| 10 | 2.3 | 10.7 | | | | | | | | | | ES |
| 11 | 4.0 | 10.0 | 0.1 | | | | | | 2.0 | | | ES |
| 12 | 2.8 | 12.4 | | | | | | | | 1.5 | | Ni |
| 13 | 7.1 | 19.2 | | | | | | | | | | Ni |
| 14 | 3.2 | 8.9 | | 1.2 | | | | | | | | Ni |
| 15 | 1.3 | 12.8 | | 4.6 | | | | | | | | Ni |
| 16 | 2.0 | 11.7 | | 3.5 | | | | | | | | Ni |
| 17 | 3.2 | 8.9 | | | | | | | 1.3 | | | Ni |
| 18 | 1.3 | 12.8 | | | | | | | 2.6 | | | Ni |
| 19 | 2.0 | 11.7 | | | | | | | 2.1 | | | Ni |
| 20 | 3.2 | 8.9 | | | | | | | | 0.9 | | Ni |
| 21 | 1.3 | 12.8 | | | | | | | | 1.6 | | Ni |
| 22 | 2.0 | 11.7 | | | | | | | | 1.9 | | Ni |

All of the alloys were deposited onto a composite material consisting of a support layer 2 made of steel and a bearing metal layer 3 made of CuPb22Sn3 (Ex. 5 was also deposited onto a bearing metal layer 3 of CuZn5Sn—variant b) and the intermediate layer 4 described in table 2 respectively. The deposition was performed by sputtering according to the aforementioned parameters.

Table 3 summarizes the test results of the given examples. The hardnesses are defined in HV(0.001). The values for the grain size of the nanoparticles are defined as minimal/average/maximum grain size.

In examples 14 to 22 the grain size has not been defined. These examples are representative of embodiment variants of the sliding layer 5 without the nanoparticles with a maximum grain size of 50 nm in the copper-rich hard phase.

TABLE 3

| | Grain size of nanoparticles | | Dirt tolerance | Fatigue strength | |
|---|---|---|---|---|---|
| Ex. | [nm] | Hardness | Amount of dirt [mg] | Wear [μm] | Visual evaluation |
| 5a | 12/25/40 | 50 | 222 | 2.7 | 1.5 |
| 5b | 10/22/40 | 48 | 206 | 3.2 | 2.0 |
| 6 | 10/23/43 | 48 | 168 | 4.3 | 3.5 |
| 7 | 12/21/34 | 63 | 137 | 3.1 | 2 |
| 8 | 10/27/46 | 52 | 194 | 5.0 | 3 |
| 9 | 12/21/39 | 54 | 141 | 6.1 | 3.5 |
| 10 | 10/27/44 | 49 | 225 | 3.2 | 2 |
| 11 | 10/28/42 | 55 | 145 | 3.4 | 2.5 |
| 12 | 12/31/45 | 56 | 153 | 2.5 | 2 |
| 13 | 13/34/48 | 65 | 144 | 1.9 | 1.9 |

TABLE 3-continued

| | Grain size of nanoparticles | | Dirt tolerance | Fatigue strength | |
|---|---|---|---|---|---|
| Ex. | [nm] | Hardness | Amount of dirt [mg] | Wear [μm] | Visual evaluation |
| 14 | — | 51 | 199 | 3.1 | 2 |
| 15 | — | 55 | 229 | 2.8 | 2 |
| 16 | — | 52 | 205 | 2.9 | 2 |
| 17 | — | 48 | 189 | 4.1 | 3 |
| 18 | — | 58 | 140 | 3.6 | 2.5 |
| 19 | — | 55 | 145 | 3.8 | 2.5 |
| 20 | — | 54 | 144 | 4.5 | 3 |
| 21 | — | 57 | 138 | 4.1 | 3 |
| 22 | — | 58 | 139 | 4.3 | 3 |

The exemplary embodiments show possible embodiment variants of the sliding layer 5 or the multi-layered plain bearing 1.

As a point of formality it should be noted that for a better understanding of the structure of the multi-layered plain bearing 1, the latter and its components have been partly represented not to scale and/or enlarged and/or reduced in size.

LIST OF REFERENCE NUMERALS

1 multi-layered plain bearing
2 support layer
3 bearing metal layer
4 intermediate layer
5 sliding layer

The invention claimed is:

1. A multi-layered plain bearing with a support layer and a sliding layer,
    wherein the sliding layer consists of a tin-based alloy with a tin matrix,
    wherein the tin-based alloy comprises tin, antimony, and copper,
    wherein the proportion of antimony is between 1 wt. % and 8 wt. %,
    wherein the proportion of copper is between 8 wt. % and 20 wt. %,
    wherein the total content of all alloy elements is a maximum of 30 wt. % and the remainder is formed by tin and manufacturing-related impurities, wherein at least a proportion of the copper forms a copper-rich hard phase with the tin, wherein the copper-rich hard phase is in the form of a deposit in the tin matrix, and wherein the copper-rich hard phase is in the form of nanoparticles with a maximum particle size of 50 nm.

2. The multi-layered plain bearing as claimed in claim 1, wherein the total content of all of the alloy elements in addition to tin is between 10 wt. % and 25 wt. %.

3. The multi-layered plain bearing as claimed in claim 1, further comprising a bearing metal layer arranged on the support layer.

4. The multi-layered plain bearing as claimed in claim 3, wherein the bearing metal layer consists of a bronze.

5. The multi-layered plain bearing as claimed in claim 4, wherein the bronze consists of at least one member selected from the group consisting of CuPb4Sn4Zn4, CuPb5Sn5Zn5, CuPb7Sn7Zn4, CuPb9Sn5, CuPb10Sn10, CuPb15Sn7, CuPb22Sn2, CuPb20Sn4, CuPb22Sn8, CuPb24Sn2, CuPb24Sn, CuPb24Sn4, CuSn5Zn, CuAl10Ni, and CuSn10.

6. The multi-layered plain bearing as claimed in claim 3, wherein the sliding layer is deposited from a gas phase onto the bearing metal layer.

7. The multi-layered plain bearing as claimed in claim 3, further comprising at least one intermediate layer arranged between the sliding layer and the support layer and arranged on the bearing metal layer.

8. The multi-layered plain bearing as claimed in claim 7, wherein the at least on intermediate layer is deposited from a gas phase onto the bearing metal layer.

9. The multi-layered plain bearing as claimed in claim 3, wherein the sliding layer has a layer thickness of at least 10 μm and a maximum of 60 μm.

10. The multi-layered plain bearing as claimed in claim 1, wherein the sliding layer has a layer thickness of at least 150 μm and a maximum of 1000 μm in a multi-component plain bearing without a bearing metal layer.

11. The multi-layered plain bearing as claimed in claim 1, wherein the sliding layer has a Vickers hardness of between 15 HV(0.001) and 70 HV(0.001).

12. The multi-layered plain bearing as claimed in claim 1, wherein the tin-based alloy further comprises at least one element selected from a first group consisting of silicon, chromium, titanium, zinc, silver and iron.

13. The multi-layered plain bearing as claimed in claim 12, wherein the proportion of the at least one element selected from the first group is between 0.1 wt. % and 2 wt. % for each of the elements silicon, chromium, titanium, zinc, silver and iron.

14. The multi-layered plain bearing as claimed in claim 1, wherein the tin-based alloy further comprises at least one element selected from a group consisting of aluminum, bismuth and nickel.

15. The multi-layered plain bearing as claimed in claim 14, wherein the proportion of the at least one element is between 0.1 wt. % and 5 wt. % for each of the elements aluminum, bismuth and nickel.

16. A multi-layered plain bearing with a support layer and a sliding layer, wherein the sliding layer comprises a tin-based alloy with a tin matrix, wherein the tin-based alloy comprises tin, antimony, and copper, wherein the proportion of antimony is between 1 wt. % and 8 wt. %, wherein the proportion of copper is between 8 wt. % and 20 wt. %, wherein the total content of all alloy elements is a maximum of 30 wt. % and the remainder is formed by tin and manufacturing-related impurities, and wherein at least a proportion of the copper forms a copper-rich hard phase with tin, which is in the form of a deposit in the tin matrix, wherein the copper-rich hard phase is in the form of nanoparticles, wherein the tin-based alloy further comprises at least one element selected from a group consisting of aluminum, bismuth and nickel, wherein the proportion of the at least one element is between 0.1 wt. % and 5 wt. % for each of the elements aluminum, bismuth, and nickel, and wherein the sliding layer is deposited via a PVD method when the particle size of the nanoparticles is greater than 50 nm.

* * * * *